(12) United States Patent
Zou et al.

(10) Patent No.: US 6,624,633 B1
(45) Date of Patent: Sep. 23, 2003

(54) DISJUNCT MRI ARRAY COIL SYSTEM

(75) Inventors: Mark X. Zou, Chesterland, OH (US); Thomas Stickle, Willoughby Hills, OH (US); James J. Wrenn, Shaker Heights, OH (US)

(73) Assignee: USA Instruments, Inc., Aurora, OH (US)

( * ) Notice: Subject to any disclaimer, the term of this patent is extended or adjusted under 35 U.S.C. 154(b) by 0 days.

(21) Appl. No.: 09/277,116

(22) Filed: Mar. 26, 1999

(51) Int. Cl.[7] .................................................. G01V 3/00
(52) U.S. Cl. ........................................ 324/318; 324/322
(58) Field of Search ................................ 324/318, 307, 324/309, 322

(56) References Cited

U.S. PATENT DOCUMENTS

| | | | |
|---|---|---|---|
| 4,486,711 A | * 12/1984 | Frese et al. .................. | 324/319 |
| 4,647,857 A | * 3/1987 | Taber .......................... | 324/309 |
| 4,825,162 A |   4/1989 | Roemer et al. ............. | 324/318 |
| 4,825,163 A | * 4/1989 | Yabusaki et al. ........... | 324/318 |
| 4,857,846 A | * 8/1989 | Carlson ....................... | 324/309 |
| 5,198,768 A |   3/1993 | Keren ......................... | 324/318 |
| 5,198,769 A | * 3/1993 | Freese et al. ............... | 324/318 |
| 5,329,232 A | * 7/1994 | Gilderdale .................. | 324/318 |
| 5,361,765 A |   11/1994 | Herlihy et al. | |
| 5,370,118 A |   12/1994 | Vij et al. | |
| 5,430,378 A |   7/1995 | Jones .......................... | 324/318 |
| 5,445,153 A | * 8/1995 | Sugie et al. ................. | 600/422 |
| 5,477,146 A |   12/1995 | Jones .......................... | 324/318 |
| 5,548,218 A |   8/1996 | Lu ............................... | 324/318 |
| 5,594,337 A |   1/1997 | Boskamp | |

* cited by examiner

Primary Examiner—Diego Gutierrez
Assistant Examiner—Dixomara Vargas
(74) Attorney, Agent, or Firm—Pearne & Gordon LLP

(57) ABSTRACT

An MRI array coil is formed from a disjunct top coil array and bottom array. Paired top and bottom loop coils image thicker portions of a subject and paired top loop-coils and bottom saddle coils image thinner portions of the subject.

13 Claims, 2 Drawing Sheets

DISJUNCT MRI ARRAY COIL SYSTEM

BACKGROUND OF THE INVENTION

The present invention relates to magnetic resonance imaging (MRI) systems, and particularly to the radio-frequency (RF) coils used in such systems.

Magnetic resonance imaging utilizes hydrogen nuclear spins of the water molecules in the human body, which are polarized by a strong, uniform, static magnetic field of the magnet (named $B_0$ or the main magnetic field in MRI physics). The magnetically polarized nuclear spins generate magnetic moments in the human body. The magnetic moments point in the direction of the main magnetic field in a, steady state, and produce no useful information if they are not disturbed by any excitation.

The generation of a nuclear magnetic resonance (NMR) signal for MRI data acquisition is accomplished by exciting the magnetic moments with a uniform RF magnetic field (named $B_1$ or the excitation field). The $B_1$ field is produced in the imaging region of interest by an RF transmit coil which is driven by a computer-controlled RF transmitter with a power amplifier. During excitation, the nuclear spin system absorbs magnetic energy, and it's magnetic moments precess around the direction of the main magnetic field. After excitation, the precessing magnetic moments will go through a process of free induction decay (FID), releasing their absorbed energy and returning to the steady state. During FID, NMR signals are detected by the use of a receive RF coil, which is placed in the vicinity of the excited volume of the human body. The NMR signal is the secondary electrical voltage (or current) in the receive RF coil that has been induced by the precessing magnetic moments of the human tissue. The receive RF coil can be either the transmit coil itself, or an independent receive-only RF coil. The NMR signal is used for producing images by using additional pulsed magnetic gradient fields, which are generated by gradient coils integrated inside the main magnet system. The gradient fields are used to spatially encode the signals and selectively excite a specific volume of the human body. There are usually three sets of gradient coils in a standard MRI system, which generate magnetic fields in the same direction of the main magnetic field, varying linearly in the imaging volume.

In MRI, it is desirable for the excitation and reception to be spatially uniform in the imaging volume for better image uniformity. In a standard MRI system, the best excitation field homogeneity is usually obtained by using a whole-body volume RF coil for transmission. The whole-body transmit coil is the largest RF coil in the system. A large coil, however, produces a lower signal-to-noise (S/N) ratio if it is also used for reception, mainly because of its greater distance from the signal-generating tissues being imaged. Since a high S/N ratio is the most desirable in MRI, special-purpose coils are used for reception to enhance the S/N ratio from the volume of interest.

In practice, a well-designed specialty RF coil is required to have the following functional properties: high S/N ratio, good uniformity, high unloaded quality factor (Q) of the resonance circuit, and high ratio of the unloaded to loaded Q factors. In addition, the coil device must be mechanically designed to facilitate patient handling and comfort, and to provide a protective barrier between the patient and the RF electronics. Another way to increase the S/N ratio is by quadrature reception. In this method, NMR signals are detected in two orthogonal directions, which are in the transverse plane or perpendicular to the main magnetic field. The two signals are detected by two independent individual coils which cover the same volume of interest. With quadrature reception, the S/N ratio can be increased by up to $\sqrt{2}$ over that of the individual linear coils.

In magnetic resonance angiography (MRA) of the lower abdomen and lower extremities of a patient, a peripheral vascular (PV) RF coil is required to cover the blood vessels from the renal arteries to the dorsal digital arteries of the feet. This coverage or the field of view (FOV) is about 132 cm for the patient population of 95 percentile. However, the commercially available MRI apparatus, as of today, has an usable imaging volume of a sphere of 45 to 50 cm diameter. To perform MRA of the peripheral vascular vessels, three consecutive scans are required to cover the field of view. Commercially available RF coils used for this application have been the system body coil and torso coil. However, the signal to noise ratio by the system body coil is too low for the application. The standard specialty torso coil does not cover the FOV for PV imaging. As a result, the torso coil has to be moved and the patient has to be positioned three times to cover the whole lower abdomen and extremities. This costs too much MRI examination time, and more importantly, does not allow bolus tracing or bolus imaging that is an important MRA procedure.

To cover a large field of view, while maintaining the S/N ratio characteristic of a small and conformal coil, a linear surface coil array technique was created to image the entire human spines (U.S. Pat. No. 4,825,162). Subsequently, other linear surface array coils were used for CTL spine imaging, such as the technique described in U.S. Pat. No. 5,198,768. These two devices consist of an array of planar linear surface coil elements. These coil systems do not work well for imaging deep tissues, such as the blood vessels in the lower abdomen, due to sensitivity drop-off away from the coil surface.

To image the lower extremities, quadrature phased array coils have been utilized such as described in U.S. Pat. No. 5,430,378 (Jones) and U.S. Pat. No. 5,548,218 (Lu). The first quadrature phased array coil (Jones) images the lower extremities by using two orthogonal linear coil arrays: six planar loop coil elements placed in the horizontal plane and underneath the patient and six planar loop coil elements placed in the vertical plane and in between the legs. Each linear coil array functions in a similar way as described by Roemer (U.S. Pat. No. 4,825,162) which is incorporated herein by reference. The second quadrature phased array coil (Lu) was designed to image the blood vessels from the pelvis down. This device also consists of two orthogonal linear coil arrays extending in the head-to-toe direction: a planar array of loop coil elements laterally centrally located on top of the second array of butterfly coil elements. The loop coils are placed immediately underneath the patient and the butterfly coils are wrapped around the patient. Again, each linear coil array functions in a similar way as described by Roemer (U.S. Pat. No. 4,845,162).

The Jones quadrature phased array coil requires very accurately controlled and fixed positioning between the two sets of linear array coils. This is because one set of loop coils are in the very sensitive center region of the other linear coil array. The two sets of arrays are orthogonal only when the geometrical symmetry is perfect, including patient loading and other interactions with the MRI system environment. This results in difficulties in manufacturing and performance consistency of the device. Secondly, the use of two orthogonal planes in the design requires that the vertical coils be placed in between the legs. This feature limits the coil from being used to cover the pelvis and the lower abdomen region which are very important in PV MRI. Another drawback of this design is that the image uniformity is not optimized since the coil system does not have sufficient sensitivity in the upper outer volume.

In the Lu quadrature phased array coil device, the loop coil array is also placed right in the very sensitive bottom center region of the butterfly coil array. Therefore, the quadrature isolation and performance of the two arrays are sensitive to the relative position of the two arrays and to the shape of the flexible butterfly volume coil array. The loop coil array has high sensitivity and coverage for the bottom volume only and the butterfly coil array covers both top and bottom volume of the lower extremities. That means there is a significant S/N ratio drop from the bottom to the top of the imaging volume.

One major limitation of the above designs is that they can not meet the image uniformity and coverage requirements for imaging the entire peripheral vascular system. Another problem is that they can not be used to perform bolus tracing, for the required coverage (minimum of 127 cm, head-to-toe), in today's existing commercially available MRI systems. To do bolus tracing, the patient is normally in the foot-in-first and supine position and the patient table is programmed (automatic control) to move with a constant speed in the head direction. Three continuous (in time) MRA scans are then conducted to image the lower abdomen, the upper leg and pelvic section, and the lower leg and foot section respectively. To cover such a large section of the human body in three MRA scans, a larger number of independent RF coil elements are required. These coil elements have to be distributed over the entire field of view. As a consequence, a larger number of MRI signal outputs have to be detected by the MRI RF receiver system continuously, without stop, during the bolus tracing period and when the patient table is moving. A typical and practical number of signal outputs is 12 to 18. The S/N ratio performance will suffer if lesser number of signal outputs are deployed since it simply means that the number of coil elements is less and therefore the average size of the coil elements is larger. The prior designs only show up to 6 signal outputs to be selectively received by the MRI receiver systems. This limitation was also caused by the limitation of the number of RF receivers these MRI systems provide. Currently, existing commercially available MRI systems provide up to 4 receivers only for simultaneous signal acquisition, with limited capability for automatic RF coil element selection or switching. To utilize more than 6 independent coil elements and therefore more than 6 signal outputs, a smart coil element selection and switching, or multiplexing device is required to automatically control and direct the MRI signals from the entire imaged volume of interest. This RF coil array multiplexing device is not available from currently commercially available MRI systems. And the prior art quadrature array coil systems do not have the capability.

SUMMARY OF THE INVENTION

It is an object of the present invention to provide an improved and advanced RF volume and surface array coil for MRI systems that cover large field of view and provides greater S/N ratio more uniformly in all directions from head-to-toe, left-right, and vertically.

A further object of the invention is an improved RF coil construction that utilizes and automatically switches and controls a larger number of independent RF coil elements and larger number (more than 6) of MRI signal outputs to allow two or more consecutive scans without stop for bolus imaging or bolus tracing.

Another object of the invention is to provide an RF array coil designed to conform to patients' abdomen and lower extremities and to place independent RF volume and surface coil elements to cover the entire volume including the patient's torso, legs, and feet.

Another object of the invention is to provide an improved volume and surface RF array coil that is disjunct with two flexible top and bottom coil arrays, convenient and easy to use by MRI technologists, and comfortable and safe to patients.

Another object of the invention is to provide an improved RF array coil that has reduced coupling between the top coil array and lower coil array, and therefore improved reliability and stability, by using polarization orthogonality of selected coil elements and patient anatomical characteristics.

Another object of the invention is to provide an improved RF array coil system that has more than one disjunct RF coil sub-arrays and each sub-array RF coil system can be used in an MRI system independently as a functioning RF coil.

An MRI coil array for imaging a subject is provided. The array includes a first coil and a second coil. The first coil is disjunct from the second coil and the coils are adapted to image the subject from generally opposite sides of the subject.

Where the subject has a first portion and a thinner second portion the coils of the first and second arrays have coils of substantially the same polarity adjacent the first portion and respective coils of orthogonal polarity adjacent the thinner second portion.

DESCRIPTION OF THE PREFERRED EMBODIMENTS

Figure 1:
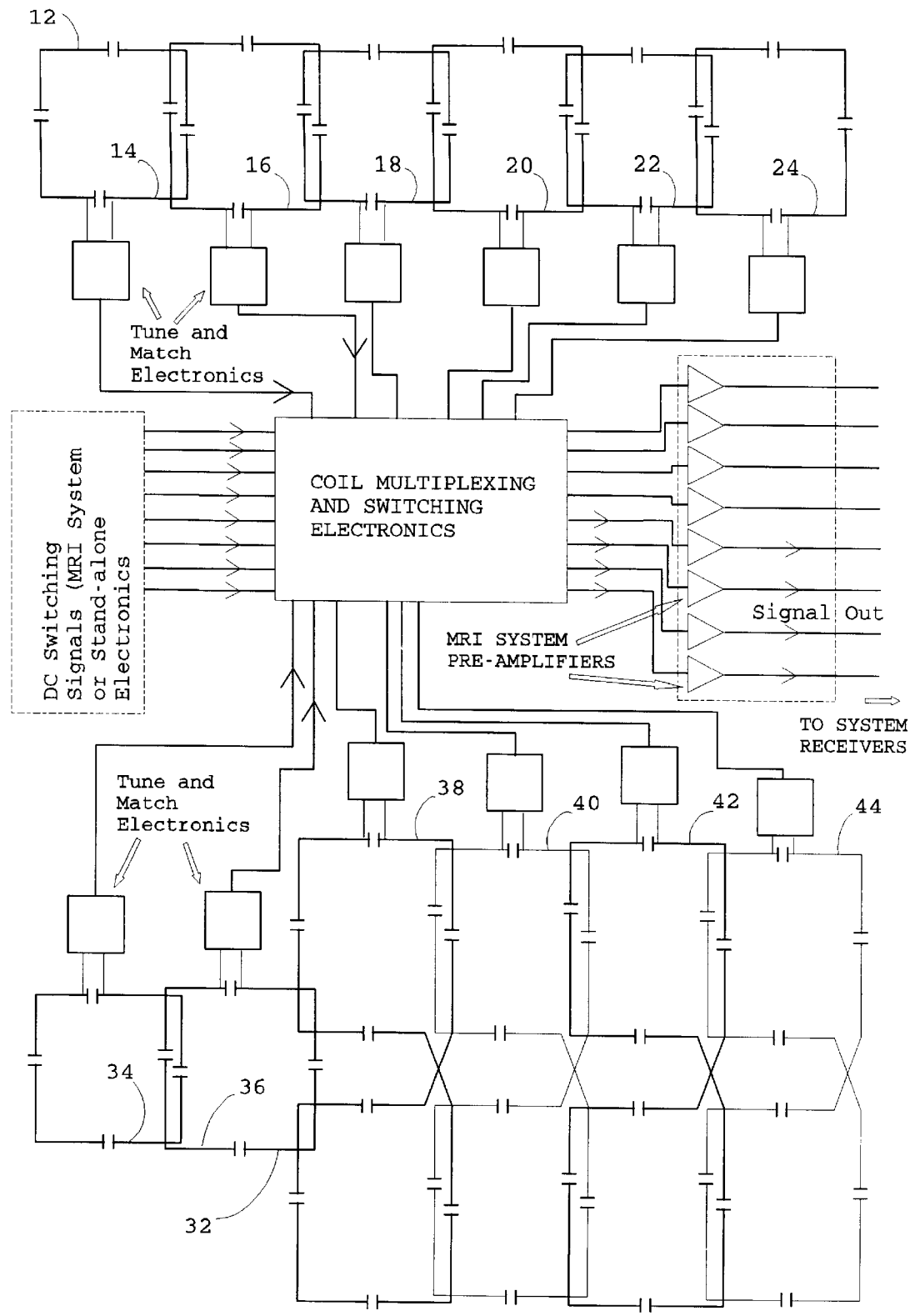
FIG. 1 is a schematic diagram of a disjunct MRI array coil system according to the invention.

Referring to FIG. 1, a first coil array 12 is formed from a series of loop coils 14, 16, 18, 20, 22, 24. Each coil may be, for example, a single turn. The first coil array 12 may, for example, be dimensioned to extend from the kidneys of a human subject (at coil 14) to the toes (at coil 24). In the preferred embodiment, the coils are encapsulated in a plastic material that provides both insulation and structural, integrity. Each coil is attached to tune and match electronics.

A second coil array 32 is formed from a series of loop coils 34, 36 and saddle coils 38, 40, 42, 44. Each coil may be, for example, a single turn (a saddle coil having two halves to each single turn). The second coil array 32 may, for example, be dimensioned to extend from the kidneys of a human subject (at coil 34) to the toes (at coil 44). In the preferred embodiment, the coils are encapsulated in a plastic material that provides both insulation and structural integrity. Each coil is attached to tune and match electronics.

Figure 2:
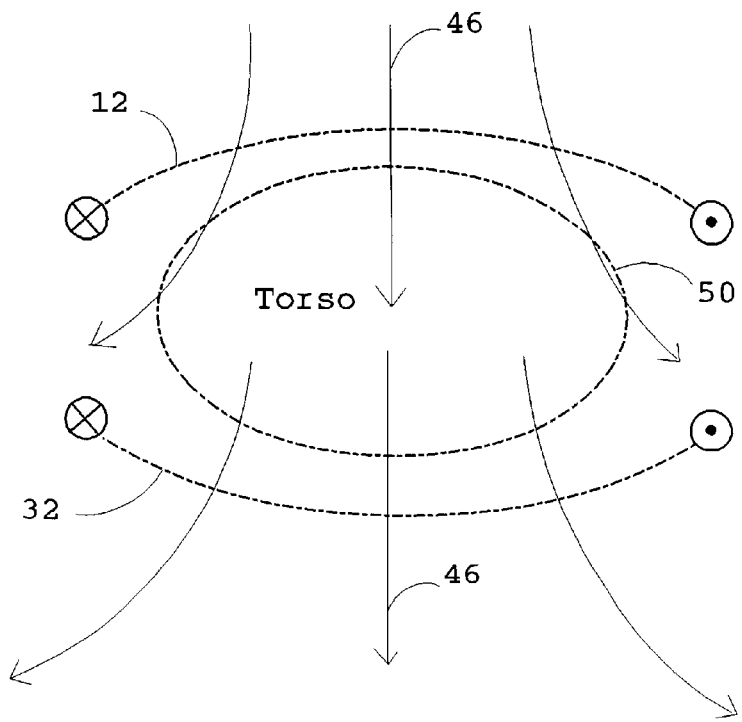
FIG. 2 is a schematic diagram of a cross section through coils 14, 16 of a disjunct coil array according to the invention.
Figure 3:
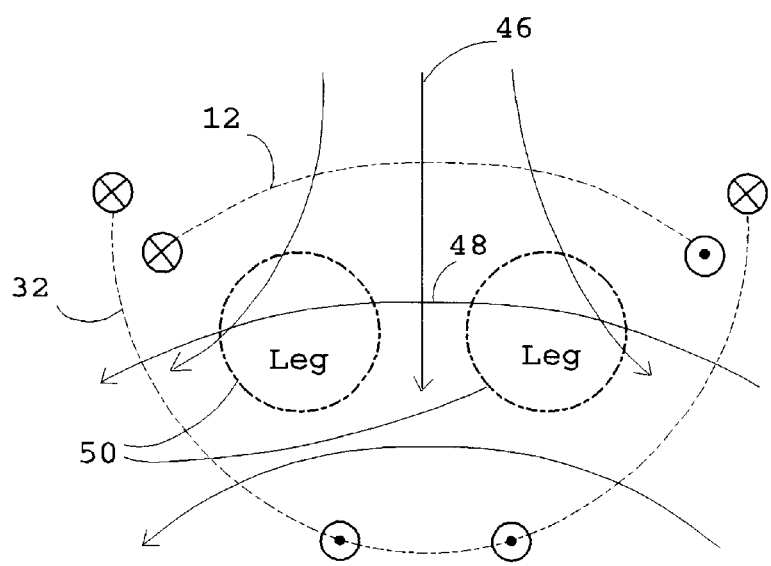
FIG. 3 is a schematic diagram of a cross section through coils 22, 42 of a disjunct coil array according to the invention.

In the preferred embodiment, the first coil array 12 would be on top of a supine human subject and the second coil array 32 would be underneath a supine human subject. The coil array 12 and the array 32 are disjunct when in an operational position. Loop coils have a polarity 46 (FIGS. 2, 3) generally perpendicular to the surface defined by the perimeter of the coil and saddle coils have a polarity 48. (FIG. .3) generally pointing in the left-right direction. As more fully explained below, it has been found that it is advantageous to generally conform the arrays 12, 32 to the. subject 50. The arrays 12, 32 are formed to generally "wrap" around the subject 50. Current flow in the conductors of FIGS. 2, 3 is indicated by "dots" and plus signs.

A supine human subject will typically be thicker in the region of the lower torso and gradually thinner in the legs. In operation, the coils of the arrays 12, 32 are operated in top and bottom pairs (e.g., loop coil 14 and loop coil 34; loop coil 16 and saddle coil 36; loop coil 18 and saddle coil 38; etc.).

In the case of the thicker lower torso area, a pair of top and bottom loop coils are able to operate simultaneously because the "depth" of each coil is chosen such that the two coils exhibit less than critical coupling. The two loop coils have the same polarity and effectively each "sees" halfway through the torso. This allows the loop coils to be smaller with an inherently better signal to noise ratio.

In the case of the thinner leg area, a pair of coils formed from a top loop coil and a bottom saddle coil are able to operate simultaneously because in addition to choosing the proper "depth" of each coil, the respective polarities of the coils are generally orthogonal. Because of this orthogonality, each coil can see substantially the same volume of the subject without interference. With orthogonal polarities, the minimum distance before critical coupling occurs is much smaller.

In the portions of the subject where a volume is being imaged by both a disjunct loop coil and a saddle coil an even better signal to noise ratio is achieved because not only are the coils of a minimum size, the orthogonal nature of the received signals allows as much as a square root of two improvement factor in the signal to noise ratio.

A further improvement in performance is obtained by conforming or wrapping the arrays 12, 32 about the subject. This is because this configuration increases the effective "depth" for a given size coil.

The disjunct MRI array coil system of the present invention can minimize interactions among the individual coil elements by using a hybrid decoupling method which is to use critical coupling, under-coupling, magnetic polarization orthogonality, and coil switching. In the top coil array 12, the nearest neighbor loop coil elements are decoupled by critical coupling under the condition with patient loading. The coil elements which are not nearest neighbors are decoupled by being switched off or deresonated actively. In the bottom coil array 32, the nearest neighbor loop (abdomen) or saddle (leg to feet) coil elements are decoupled by critical coupling under the condition with patient loading. The coil elements which are not nearest neighbors are decoupled by being switched off or deresonated actively. Between the top array torso/abdomen loop coil elements and the bottom array torso/abdomen loop coil elements, the magnetic or inductive interactions are limited by meeting the inductive under-coupling condition in the environment of patient loading. Between the top array leg/feet loop coil elements and the bottom array leg/feet saddle coil elements, the magnetic or inductive interactions are inhibited by magnetic polarization orthogonality of the two types of coils and by patient loading. The loop coils have sensitivity to magnetic flux in the vertical direction and the saddle coils have sensitivity to magnetic flux in the left-right horizontal direction. The induced eddy current flowing in the patient tissue plays a role of RF shielding, and therefore further reducing the cross-coupling between the top and bottom coil elements.

The system of the present invention consists of more coil elements (12 elements in the preferred design) than the total number of RF receivers provided in today's MRI systems (4 to 6). The total coverage of the array coil system is about three times of the diameter of the sphere of the useful imaging volume of the magnet (about 44 cm diameter sphere). To image from the lower abdomen to the feet, the array coil system has the capability to allow the MRI system to perform three consecutive scans (non-stop) without manually repositioning the patient relative to the array coil. This coil capability works in parallel with the remote positioning capability of the MRI system patient table. To perform three consecutive scans without stopping, the array coil system utilizes a coil multiplexing and switching electronics module (FIG. 1) which is integrated in the array coil system. The coil multiplexing and switching electronics consists of a PIN diode matrix, tuned RF blocking circuits, and DC isolation components. The coil multiplexing and switching electronics utilizes available DC switching signals available from the MRI system or from a stand-alone electronic module with DC signal sources. By programming the state or configuration of the DC switching signals, the coil multiplexing and switching electronics will activate (select) certain coil elements in the top and bottom arrays, switch off (de-select or deresonate) certain coil elements, and direct or send the MRI signals from the selected coil elements to the proper pre-amplifier channels. Then the signals will be detected by the system receivers of the MRI system. This multiplexing and switching capability allows the array coil system to work with the patient remote positioning (automatic control of the patient transportation table) capability of the MRI system to perform consecutive MRI scans continuously (in time) for imaging larger field of view than the useful coverage of the magnet. This feature enables the array coil-system to automatically switch and control larger number of independent RF coil elements and larger number (more than 6) of MRI signal outputs for two or more consecutive scans without stopping and enables bolus imaging or bolus tracing.

Another ability of the array coil system of the present invention is to perform MRI imaging by using the top array or the bottom array coil independently. The two coil arrays are designed in such a way that they can be quickly disconnected from each other and either one of the coil arrays can be plugged in the MRI system by using an adapter/cable assembly. This feature allows one of the two coil arrays to be used as an independent RF coil for more clinical applications such as long bone imaging and T/L spine imaging.

Mutual inductance between two coils of inductance $L_p$ and $L_s$ may be expressed as $M=k(L_p L_s)^{1/2}$ in which k is the coefficient of coupling. The quality factor Q of a resonant circuit at the resonant frequency $\omega_0$ may be $Q=\omega_0 L/R$, where R is the resistance. For the case of maximum power coupling between two coils, i.e., critical coupling, the coefficient of coupling becomes $k_c$, where $k_c=1/Q$. If $k>k_c$, the coils are said to be overcoupled and for $k<k_c$, the coils are said to be undercoupled. The distance between two coils where critical coupling occurs may be said to be the critical coupling distance.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed:

1. An MRI RF coil array for imaging a subject, said array comprising:
    a first RF coil; and
    a second RF coil, said first coil being disjunct from said second coil and said coils being adapted to image said subject from generally opposite sides of said subject, wherein said first coil is a loop coil and said second coil is a saddle coil.

2. An array according to claim 1, wherein said coils are spaced apart by at least a substantial portion of the critical coupling distance of said first and second coils.

3. An MRI RF coil array for imaging a subject, said array comprising:
    a first RF coil array having a plurality of coils; and
    a second RF coil array having a plurality of coils, said first coil array being disjunct from said second coil array and said first and second coil arrays being adapted to image said subject from generally opposite sides of said subject, wherein at least one coil of said first coil array is a loop coil and at least one coil of said second coil array is a saddle coil.

4. An array according to claim 3, wherein said first and second coil arrays are spaced apart by at least a substantial portion of the critical coupling distance of each coil said first and second coil arrays.

5. An MRI RF coil array for imaging a subject, said array comprising:
    a first RF coil array having at least two adjacent coils of a first polarity; and
    a second RF coil array having at least one coil having a polarity substantially the same as said first polarity and at least one coil having a polarity substantially orthogonal to said first polarity, said first coil array being disjunct from said second coil array and said second coil array being adapted to be located generally opposite said first coil array about said subject.

6. An array according to claim 5, wherein said coils of a first polarity are loop coils and said at least one coil having a polarity substantially orthogonal to said first polarity is a saddle coil.

7. An array according to claim 5, wherein said first and second coil arrays are spaced apart by at least a substantial portion of the critical coupling distance of each coil of said first and second coil arrays.

8. An MRI coil array for imaging a subject having a first portion and a thinner second portion, said array comprising:
    a first coil array; and
    a second coil array, said first and second coil arrays being adapted to image said subject from generally opposite sides of said subject, wherein coils of said first and second arrays have coils of substantially the same polarity adjacent said first portion and respective coils of orthogonal polarity adjacent said thinner second portion.

9. An array according to claim 8, wherein said coils adjacent said first portion are loop coils and said respective coils of orthogonal polarity adjacent said thinner second portion are respectively loop coils and saddle coils.

10. An array according to claim 8, wherein said first and second coil arrays are generally conformed about said subject.

11. An array according to claim 8, wherein said first and second coil arrays are spaced apart by at least a substantial portion of the critical coupling distance of each coil of said first and second coil arrays.

12. An array according to claim 8, wherein said first and second coil arrays may be used to separately image said subject.

13. An array according to claim 8, wherein the coils of said first and second coil arrays are switched and multiplexed to perform two or more consecutive scans without stopping.

* * * * *